United States Patent
Tsai et al.

(10) Patent No.: US 6,901,342 B2
(45) Date of Patent: May 31, 2005

(54) TEST WAFER USAGE FORECAST MODELING METHOD

(75) Inventors: Yi-Chun Tsai, Hsin-Chu (TW); Jung-Sheng Jao, Hsin-Chu (TW); Tai-Kun Lin, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/377,004

(22) Filed: Feb. 28, 2003

(65) Prior Publication Data

US 2004/0172211 A1 Sep. 2, 2004

(51) Int. Cl.[7] .............................................. G06F 19/00
(52) U.S. Cl. ........................................ 702/117; 438/14
(58) Field of Search ....................... 702/117; 356/237.5, 356/418; 219/486; 430/5, 22; 73/61.72; 250/492.21

(56) References Cited

PUBLICATIONS

Foster et al., Simulation of Test Wafer Consumption in a Semiconductor Facility, IEEE/SEMI Advanced Semiconductor Manufacturing Conference, p. 298–302, 1998.*

Foster et al., "Simulation of Test Wafer Consumption in a Semiconductor Facility", 1998 IEEE/SEMI Advanced Semiconductor Manufacturing Conference, pp. 298–302.

Popovich et al., "Implementation of a Test Wafer Inventory Tracking System to Increase Efficiency in Monitor Wafer Usage", 1997 IEEE/SEMI Advanced Semiconductor Manufacturing conference, pp. 440–443.

* cited by examiner

Primary Examiner—John Barlow
Assistant Examiner—Xiuqin Sun
(74) Attorney, Agent, or Firm—Duane Morris LLP; Steven E. Koffs

(57) ABSTRACT

A method for modeling usage of semiconductor test wafers comprises the steps of: calculating an individual demand for test wafers by each of a plurality of tools, assigning respective ones of the plurality of tools to a plurality of levels based on ability of each tool to use wafers that have been processed by another one of the plurality of tools, assigning wafers made available by one of the plurality of tools to at least two other ones of the plurality of tools in proportion to the individual demands of each of the at least two other tools, and determining a total demand for test wafers, based on the number of wafers assigned to each of the plurality of tools in the lowest one of the plurality of levels.

23 Claims, 4 Drawing Sheets

Working Days: 31

| EQ Type | Cham. Qty | Tool Qty | Monitor Item | T/W Type | Total move [1] | Time based Usage [2][3] | | Wafer based Usage [4][5] | | Fail Rate [6] | Demand Move [7] | Reuse Rate [8] | Physical Pieces [9] |
|---|---|---|---|---|---|---|---|---|---|---|---|---|---|
| | | | | | | Unit usage | day | Unit usage | move | | | | |
| Tool A | 4 | 1 | Thickness | Pa<15 | 3000 | 1 | 1 | 2 | 500 | 5% | 45 | 2 | 23 |
| Tool B | 4 | 1 | PA/RS | N | 2000 | 1 | 7 | - | - | 3% | 5 | 1 | 5 |
| .. | .. | .. | .. | .. | .. | .. | .. | .. | .. | .. | .. | .. | .. |
| .. | .. | .. | .. | .. | .. | .. | .. | .. | .. | .. | .. | .. | .. |

FIG. 3

TEST WAFER USAGE FORECAST MODELING METHOD

FIELD OF THE INVENTION

The present invention relates to semiconductor fabrication.

BACKGROUND

Elaborate techniques have been developed for quality control in the semiconductor fabrication industry. One widely used technique is the use of test wafers in the production line. The test wafers are subjected to the same processes as the integrated circuit wafers in the production line, but the test wafers have special patterns that are particularly suited for detecting variations in the processing that can produce defects and affect quality or function. A typical fabrication facility (also referred to as a "fab") starts between 0.1 and 3 test wafers for every production wafer, with an average number being about 0.8 test wafer per production wafer.

Test wafers are expensive; some cost more than $100. A fab that processes about 150,000 production wafers per year could spend between $7 Million and $20 Million per year just for the test wafers. Because of the large cost of test wafers, it is common practice to reuse, recycle and reclaim test wafers as often as possible. Wafers are reused by processing a wafer in a second pass through the same tool, or through a second tool. Wafers are recycled by subjecting them to a chemical cleaning process to prepare them for further use. Wafers that cannot (or can no longer) be recycled are reclaimed by polishing the surface. The reclaimed wafer is like a new wafer, except the polishing reduces its thickness. Generally speaking, a new test wafer can only be reclaimed 4 to 5 times due to minimum thickness constraint. New or reclaimed test wafers might be used for several times by recycling.

Popovich, Sandy et al., "Implementation of a Test Wafer Inventory Tracking System to Increase Efficiency in Monitor Wafer Usage," IEEE/SEMI Advance Semiconductor Manufacturing Conference, June 1997, pp 440–443, is incorporated by reference herein. Popovich et al. describe a system that automates the wafer ordering process and forces re-use of existing wafers.

Foster, Bryce et al., "Simulation of Test Wafer Consumption in a Semiconductor Facility," IEEE/SEMI Advance Semiconductor Manufacturing Conference, August, 1998, pp 298–302, is incorporated by reference herein. Foster et al. describe a simulation of wafer usage, in which any test wafer has a fixed probability of being suitable for re-use. Foster et al. note, "The types of test wafers downgraded between monitors are not tracked. (e.g., a Low Quality test wafer can be downgraded to a monitor/stockpile that uses High Quality test wafers)."

A given recycled test wafer cannot, however, be used for testing every possible flow. A wafer that can no longer be reused in the same tool, but can be passed to another tool for use is "downgraded." The sequence of tools that can use a test wafer during a series of operations separated by downgrades defines a "downgrade flow." A downgraded wafer can be used for monitoring certain tools, but not others. Some monitoring operations require a new or reclaimed wafer. Some monitoring operations require new or reclaimed wafers or wafers that have only been subjected to certain processing steps (but not others).

In addition to the downgrade flow constrains, some tools cannot be tested using a raw test wafer, but need test wafer that are first processed by certain tools. For example, film deposition process steps are necessary for a test wafer used by an etch-rate monitor in etch tools. That means, capacity must be reserved in film deposition tools for preparing etch-rate test wafers.

Thus, inventory management of test wafers is a complex matter, for which a better understanding is desired.

SUMMARY OF THE INVENTION

In some embodiments, a method for modeling usage of semiconductor test wafers comprises the steps of: calculating an individual demand for test wafers by each of a plurality of tools, calculating a respective flow demand for each downgrade flow among the plurality of tools based on the individual demands, and determining a total demand for each type of test wafer based on the flow demands, taking into account at least one constraint limiting the ability for one of the tools to use test wafers from at least one of a plurality of upstream tool sources.

In some embodiments, a method for modeling usage of semiconductor test wafers comprises the steps of: calculating an individual demand for test wafers by each of a plurality of tools, assigning respective ones of the plurality of tools to a plurality of levels based on ability of each tool to use wafers that have been processed by another one of the plurality of tools, assigning wafers made available by one of the plurality of tools to at least two other ones of the plurality of tools in proportion to the individual demands of each of the at least two other tools, and determining a total demand for test wafers, based on the number of wafers assigned to each of the plurality of tools in the lowest one of the plurality of levels.

In some embodiments, a method for modeling usage of semiconductor test wafers, comprising the steps of: calculating an individual demand for test wafers by each of a plurality of tools, assigning the plurality of tools to a plurality of levels based on ability of each tool to use wafers that have been processed by another one of the plurality of tools, assigning wafers made available by the plurality of tools to downstream tools in the plurality of tools, including assigning wafers made available by one of the plurality of tools to at least two other ones of the plurality of tools in proportion to the individual demands of each of the at least two other tools, and determining a total demand for test wafers, based on the number of new or reclaimed wafers assigned to a subset of the plurality of tools, wherein the new or reclaimed wafers are not provided from upstream tools within the plurality of tools.

BRIEF DESCRIPTION OF THE DRAWINGS

FIG. 3 is a table showing computation of individual tool demands.

DETAILED DESCRIPTION

Figure 1A:
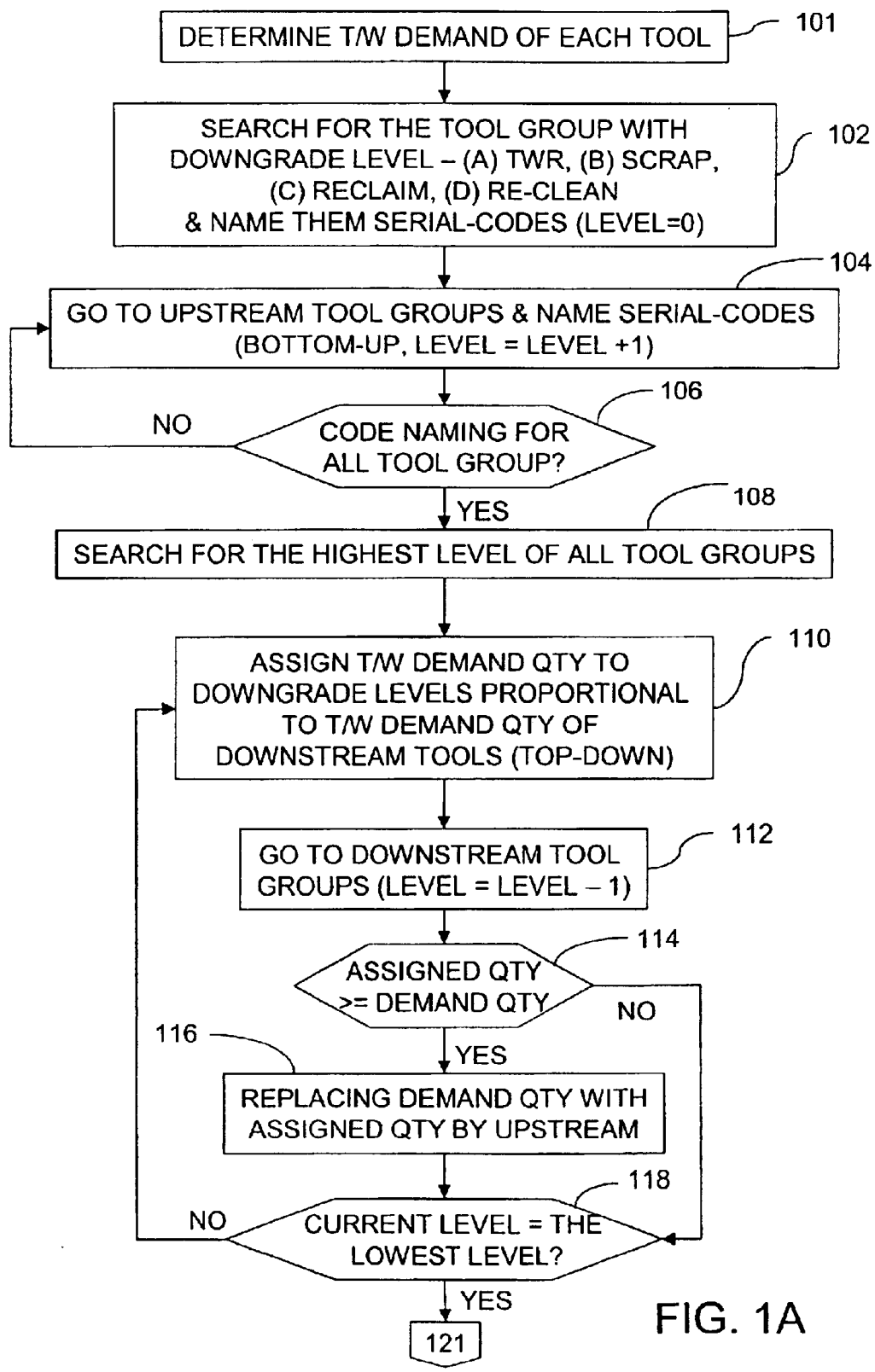
FIGS. 1A and 1B are flow charts of a method according to one embodiment of the invention.
Figure 1B:
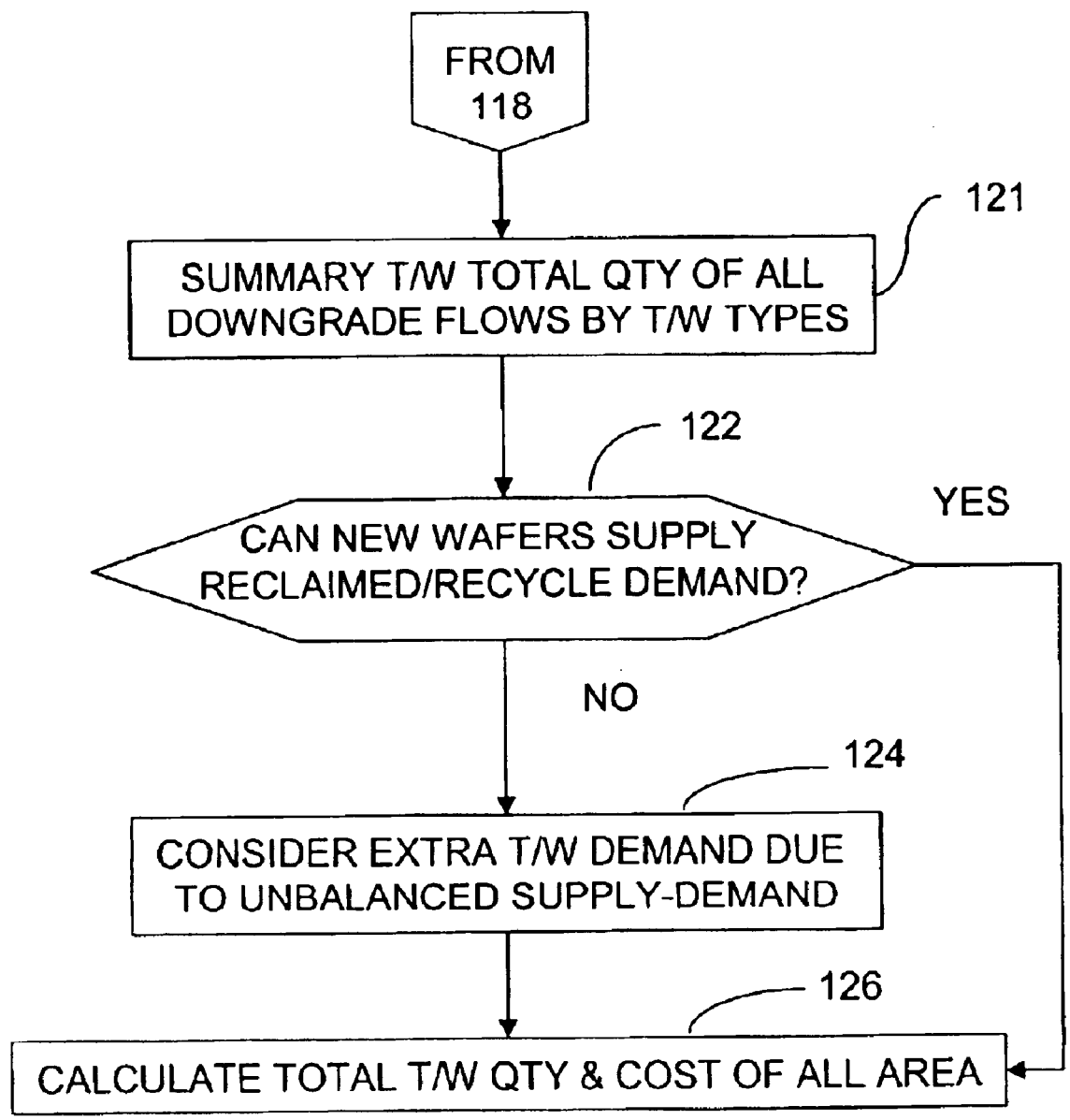
Figure 2:
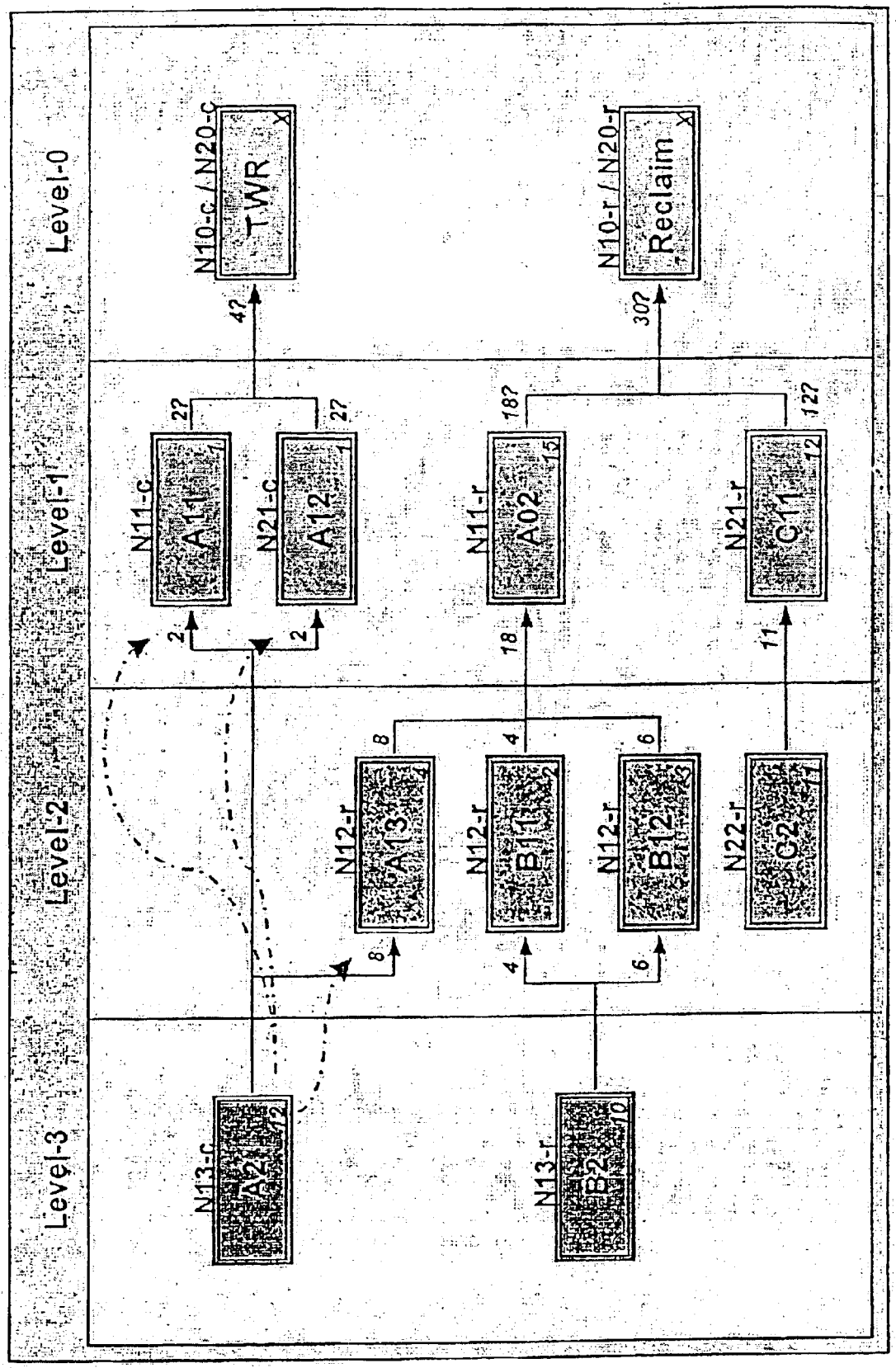
FIG. 2 is a diagram showing wafer downgrade paths in a fab, with wafer demand and assignments.

FIGS. 1A and 1B are flow charts of an exemplary method for modeling usage of semiconductor test wafers. FIG. 2 is a diagram of an example showing a plurality of tools and the downgrade paths identified by the method of FIGS. 1A and 1B. The technique described for analyzing the wafer usage in FIGS. 1A and 1B may be done manually, but the method also is suitable for implementation in a computer software program, which can be written in a variety of programming languages.

In FIG. 2, test wafer usage by each monitor is indicated by a respective serial code according to the following naming convention:

Serial Code=ABC–D, where

A is the type of test wafer required (in FIG. 2, all test wafers are of type "N".
B is the number of the downgrade flow.
C is the level number of the downgrade flow.
D is the final destination of downgrade flow ("C"=recycle, "R"=reclaim).

At step 101, the individual tool demand of each tool in the fab is identified. In FIG. 2, the demand of each tool appears in the lower right hand corner of the box representing the tool. For example, the demand of tool A2 is 12 wafers, the demand of tool B2 is 10 wafers, and so on.

The individual demand of each tool takes into account a reuse rate of the test wafers. For example, if a tool uses 20 wafers, and the tool can use the same wafer four times before recycling or reclaiming the wafer, then the demand of that tool is five wafers.

The individual demand by each tool takes into account the individual failure rate of the test wafers used by each tool. For example, if P is the probability that a test wafers fails in a given tool, then the demand for that tool is increased by the formula:

Demand=Demand*(1+$P$), where "=" refers to assignment of a value.

FIG. 3 shows the exemplary method of determining individual tool demand. The number of days in the reference monitoring period (e.g., 31) is identified. A row is provided for each tool, in this case, tools A and B. The first three column identify the tool, the number of wafers concurrently processed in the tool, and the number of units of the tool. The monitor item column identifies the parameter that is monitored (e.g., layer thickness). The test wafer type column indicates the type of wafer (e.g., fewer than 15 particles).

Column 1 identifies the total number of processing "moves" during the relevant period. This indicates the number of times the processing activity is performed by the tool during the reference monitoring period (e.g., 3000 for tool A, 200 for tool B).

Columns 2 and 3 set forth monitoring requirements for a tool that are based on the passage of time. A given tool may require monitoring to be performed a specified number of times per day, week or month. Column 2 indicates the number of test wafers used each time the period of time specified in column 3 passes.

Columns 4 and 5 set forth wafer based usage (processing move-based usage). A given tool may require monitoring to be performed a first specified number of times when a second specified number of production wafers are processed. Column 4 indicates the number of test wafers used each time the number of production wafers in column 5 are processed by the given tool.

Column 6 specifies the failure rate for the test wafers in each tool. The number of test wafers demanded by any individual tool are increased based on this number.

Column 7 specifies the number of "demand moves" or test wafer processing iterations. This number includes both the time based monitoring and wafer based monitoring. This number does not take into account the ability to reuse a wafer in the tool without recycling or reclaiming the wafer.

This number is calculated according to the equation:

$$[7]=\{(\text{Working day})*[2]/[3])+([1]*[4]/[5])\}*(1+[6]),$$

where the number in brackets indicates the value in the column specified by that number.

For example, in the case of tool A, the number of "demand moves" equals {31 days*(1 test wafer/1 day)+3000 production wafers*(2 test wafers/500 production wafers)}*(1.05)= 45 test wafers.

Column 8 specifies the test wafer reuse rate, i.e., the number of times the test wafer can be used without recycling or reclaiming. For example, tool A can use the same wafer twice before recycling or reclaiming the wafer.

Claim 9 specifies the number of physical wafers needed to satisfy the tool's demand, taking into account its ability to reuse a wafer. This number is calculated by:

[9]=[7]/[8], where the number in brackets indicates the value in the column specified by that number.

In this example, tool A requires 23 physical wafers to satisfy its 45 "demand moves," given that each wafer can be used twice before recycling or reclaiming.

A person of ordinary skill in the field can readily fill in a table like that shown in FIG. 3 for all of the tools in a given fab.

In preferred embodiments, the information of FIG. 3 is stored in a spreadsheet, so that the affect of varying the parameters (e.g., number of production processing moves, and turning a chamber on or off) on individual tool demand can easily be identified.

Further, a single tool may be represented by more than one row in the table of FIG. 3, if more than one monitoring activities are performed for the same tool. For example, a tool may have one row for an etch-rate monitor, and another row for a particle monitor. The same tool may have different monitor frequencies for each of the respective monitors.

Referring again to FIG. 1A, at step 102, the tools having the lowest downgrade levels are identified. These downgrade levels include: test wafer recycle (TWR), scrap, reclaim, or re-clean. A wafer that has been processed by any of the tools in this group is not suitable for immediate use in another process monitor operation. Such a wafer must either be further processed to prepare it for use, or scrapped. These tools are given an identifier corresponding to the lowest downgrade level, which is "0" in the example. In FIG. 2, the level-0 tools are identified by serial codes in which the third character is a "0". In this example, the level-0 serial codes are N10-c/N20-c (TWR) and N10-r/N20-r (Reclaim).

At step 104 (FIG. 1A), for each of the level-0 tools, the set of immediately upstream tools is identified. For a given level-0 tool, the respective set includes all of the tools that process wafers usable by that level-0 tool. This set is generally different for each of the downstream (level-0) tools. In FIG. 2, these upstream tools include the tools designated A11, A12, A02, and C11. Once all of the upstream tools are identified for each level-0 tool, the downstream paths from each of the upstream tools is identified. Any tool that only outputs test wafers suitable for use by one of the level-0 tools (e.g., A11, A12, A02, C11) is a level-1 tool. If any of the upstream tools outputs test wafers usable by both a level-0 tool and another level-1 tool, then that tool is assigned a higher level than level 1. Having identified the level 1 tools, each is assigned a serial code having the third character "1". In this case, A11 is assigned N11-c, A12 is assigned N21-c, A02 is assigned N11-r, and C11 is assigned N21-r.

At step 106, step 104 is repeated for each succeeding level.

All of the upstream tools that output wafers usable by a level-1 tool are identified. In FIG. 2, these include A2, A13, B11, B12 and C2. The tools in this group that only output test wafers suitable for use by a level-1 or level-0 tool are assigned level 2. A13, B11, B12 and C2 fall into this category. The remaining tool (A2) also outputs wafers usable by a level-2 tool (A13). For this reason, tool A2 is assigned a level higher than 2. Each of the level 2 tools A13, B11, B12 and C2 is assigned a serial code having the third character "2". In this case, A13 is assigned N12-r, B11 is assigned N12-r, B12 is assigned N12-r, and C2 is assigned N22-r.

All of the upstream tools that output wafers usable by a level-2 tool are identified. In FIG. 2, these include A2 and B2. The tools in this group that only output test wafers suitable for use by a level-2, level-1 or level-0 tool are assigned level 3. Both A2 and B2 fall into this category. If there is a tool that outputs wafers usable by a level-3 tool (none shown), such tool is assigned a level higher than 3. Each of the level 3 tools A2 and B2 is assigned a serial code having the third character "3". In this case, A2 is assigned N13-c, B2 is assigned N13-r.

In general, a tool is assigned to a level N of the plurality of levels, if wafers processed by that tool are only usable as test wafers by tools in levels from level 0 to level N-1. Further, if level N-1 is the highest level of any recipient tool to which a given tool can provide test wafers, then the given tool is assigned to level N.

When there are no more tools to be assigned levels, step 108 (FIG. 1A) is executed.

At step 108, the highest level is identified. In the example of FIG. 2, the highest level is "3".

At step 110, beginning at the highest level (e.g., level-3 in FIG. 2), the test wafers released from a tool are divided among the downstream tools capable of using wafers from the tool that is releasing the wafers, in proportion to the demand by each of these downstream tools. At the highest level, all of the wafers are either new or reclaimed/recycled (i.e., all types except scraped wafers).

For example, tool A2 processes 12 test wafers in a given period, based on its own requirements for time based monitoring and wafer based monitoring. The wafers released from tool A2 can be used by tools A11, A12 and A13. Wafers A11, A12 and A13 require 1, 1 and 4 wafers (6 total), respectively, based on their own time based monitoring and wafer based monitoring requirements. Thus, the 12 wafers from tool A2 are divided as follows:

A11 receives (12/6)*1=2 wafers.

A12 receives (12/6)*1=2 wafers.

A13 receives (12/6)*4=8 wafers.

Similarly, tool B2 processes 10 test wafers, which are capable of use by tools B11 and B12. Tools B11 and B12 require 2 and 3 wafers, respectively (5 total).

B11 receives (10/5)*2=4 wafers.

B12 receives (10/5)*3=6 wafers.

At step 112, select the next level's demand quantity data for check in step 114 (e.g., level-2).

At step 114, the number of wafers required by each tool (based on its own time based monitoring and wafer based monitoring requirements) are compared to the number assigned from the upstream tool(s). For example, tool A13 has a demand for 4 test wafers, but is assigned 8 test wafers from tool A2. Thus, for tool A13, the value of the expression "assigned quantity greater than or equal to the demand quantity" is .TRUE., and step 116 is executed. Similarly, for tool B11, 2 wafers are demanded and 4 are assigned from tool B2, so the value of the expression is .TRUE. For tool B12, 3 wafers are demanded and 6 are assigned from tool B2, so the value of the expression is .TRUE. Step 116 is executed for all three of these tools. In the case of tool C2, there is no upstream tool. The demand quantity (11) is greater than the assigned quantity (0), so the value of the expression is .FALSE., and step 118 is executed next.

At step 116, for those tools receiving more wafers from upstream tools than are required by their own tool demand, the tool demand is replaced by the number assigned from upstream, for purpose of determining how many wafers the downstream tool can release to the next lower level. This value is indicated in FIG. 2 by the number immediately to the right of each box. In the case of tool A13, 8 wafers are available to the next level downstream, even though tool A13 only demands 4. All of the wafers assigned to a tool are made available to the tools at the next lower level (Assume that no test wafer is damaged or scraped during downgrade processes). Similarly, for tool B11, 2 wafers are demanded and 4 are assigned from tool B2. Thus tool B11 makes 4 wafers available. For tool B12, 3 wafers are demanded and 6 are assigned from tool B2. Thus tool B12 makes 6 wafers available.

Because step 116 is not executed for tool C2, the demand quantity (11) is retained for tool C2, reflecting that tool C2 makes 11 wafers available to the next lower level.

At step 118, if the lowest level of the hierarchy has not yet been reached, then steps 110-118 are repeated.

In the example of FIG. 2, tools A13, B11, B12 can only provide wafers to tool A02, so the allocation step 110 merely results in 100% of the wafers being assigned to tool A02. Similarly, tool C2 can only provide wafers to tool C11, so the allocation step 110 merely results in 100% of the wafers being assigned to tool C2.

When steps 114-116 are executed at level 1, tools A11, A12 and A02 all are assigned (from their upstream tools) more wafers than needed for their own (time based and wafer based) monitoring demand. Thus, each of tools A11, A12 and A02 has its available quantity (shown to the right of the box for each tool) increased to make available all of the tools received from the upstream tools.

Tool C11, on the other hand, demands 12 wafers for its own time based and wafer based) monitoring needs, while only receiving 11 wafers from the upstream tool C2. Thus, tool C2 requires an additional wafer, which requires a new or reclaimed wafer to be supplied directly to tool C11.

At the last level, all of the wafers from tools A11 and A12 are made available for recycling, and all of the wafers from tools A02 and C11 are available to be reclaimed.

At step 121, a summary of the test wafer total for all the downgrade flows can be determined by wafer types, based on the flow demands, taking into account the constraints limiting the ability for one of the tools to use test wafers from at least one of a plurality of upstream tool sources. FIG. 2 shows the basis for calculating a respective flow demand for each flow processed by the plurality of tools, based on the individual demands. Although the individual tool demands (in the lower right corner of the respective box representing each tool) add up to 71 wafers, the total number of wafers that must be supplied to satisfy all of the downgrade flows is only 34. These 34 include 12 new (or reclaimed wafers) supplied to tool A2, 10 wafers supplied to tool B2, 11 wafers supplied to tool C2, and 1 wafer supplied to tool C11. These may, for example, correspond to the four test wafer types: (a) new test wafer, (b) recycled test wafer with number of particles <10, (c) recycled test wafer with number of particles <50, and (d) reclaimed test wafer.

Where there is no crossover between downgrade flows, then the global demand can be determined by the sum of the respective maximum individual demands in each downgrade flow. (Crossover indicates that a tool in a first downgrade flow can provide wafers to be used in a tool in a second downgrade flow different from the first downgrade flow.) With no crossover, a respective flow demand is determined for each downgrade flow processed by the plurality of tools, based on the individual demands, and taking into account the number of wafers made available by downgrading from higher level tools. This means that the demand for a flow is the maximum demand from all of the tools within that flow.

In the case of FIG. 2, there is a crossover between flows, in that tool A2 can provide wafers to either the recycle downgrade flow or the reclaim downgrade flow. Tool A13 receives wafers from tool A2 in a first downgrade flow, but supplies wafers to tool A02 in a second downgrade flow that begins with tool B2.

The example of FIG. 2 shows two alternative methods for calculating the total global demand for a fab. Both methods yield the same total, even when there is crossover between downgrade paths. In the first alternative method, the total demand for test wafers can be calculated by summing the number of wafers assigned to each of the plurality of tools in the lowest one of the plurality of levels. Tools A11, A12, A02 and C11 are assigned 2, 2, 18 and 12 test wafers, respectively. The sum of 2, 2, 18 and 12 is 34. This result is intuitive, because if each wafer is reused or downgraded as often as possible, then each physical wafer at the lowest level represents a requirement for another physical wafer to be added to the system.

In the second alternative method, the numbers of new or reclaimed wafers added to each tool in the system are added together. As noted above, this includes 12 wafers supplied to tool A2, 10 wafers supplied to tool B2, 11 wafers supplied to tool C2, and 1 wafer supplied to tool C11. The sum of 12, 10, 11 and 1 is the same result—34.

At step 122, the quantity of available new wafers is compared to the total flow demand for each type of wafer (including reclaimed and recycled wafers). If the quantity of new wafers is not sufficient to supply the demand for every wafer type, then step 126 is executed next. If the quantity of new wafers is sufficient then step 124 is executed.

Step 122 can be automated. For example, at any given point in time, if the supply of any given wafer type is inadequate, then a determination is made whether there is a surplus of the next higher quality type of wafer. This determination can be repeated until the lowest quality wafer type having the surplus quantity is identified. That surplus can be redirected and applied towards the demand for the wafer type that is insufficient. If the surplus is not sufficient, so that the supply of that wafer type is till not satisfied, then the process can be repeated, finding the next lowest quality wafer type having a surplus, and applying that surplus to correct the deficiency. If every available surplus is applied, and there is still a deficiency in the quantity of at least one wafer type, then step 126 is executed next.

At step 124, to figure out how to address a flow with unbalanced wafer supply and demand, a study is made to study whether it is practical to re-arrange the downgrade sequence or adjust monitor frequency to save test wafer cost.

At step 126, the total test wafer quantity and cost for all areas of the fab is calculated, taking into account any changes made at step 124.

In the discussion above, it is assumed that all tools are operating, and that each chamber of each tool is operation. A model as described above can be set up with parameters including the ability to turn individual tools and chambers on or off, to reflect the tool and chamber on/off status. The effects of availability/unavailability of each machine can be analyzed.

The method described above allows effective analysis and allocation of wafers, taking into account availability of wafers, product mix and chamber (on or off) status. Downgrade and recycle flows among areas can be effectively analyzed, and global test wafer demand calculated. Total test wafer expense may be reduced. The pre-process capacity reserve (of test wafers) can be reduced, and the available test wafers can be made available for use a greater percentage of the time. The risk of a test wafer shortage can be reduced. Test wafer usage and costs can be forecast more accurately.

The exemplary method allows more accurate test wafer capacity forecasting during downturns, when one or more tools are shut down. During full capacity operations, the exemplary method allows forecasts of capacity reservation required for bottleneck tools. Capacity shortages can be highlighted earlier for backup activity preparation.

The exemplary embodiments of present invention may be embodied in the form of computer-implemented processes and apparatus for practicing those processes. Other embodiments are in the form of computer program code embodied in tangible media, such as random access memory (RAM), floppy diskettes, read only memories (ROMs), CD-ROMs, DVD-ROMs, hard drives, high density (e.g., "ZIP™") removable disks, or any other computer-readable storage medium, wherein, when the computer program code is loaded into and executed by a computer, the computer becomes an apparatus for practicing the invention. Other embodiments are in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for modeling usage of semiconductor test wafers, comprising the steps of:
   (a) calculating an individual demand for test wafers by each of a plurality of tools;
   (b) calculating a respective flow demand for each downgrade flow among the plurality of tools, based on the individual demands;
   (c) determining a total demand for each type of test wafer, based on the flow demands, taking into account at least one constraint limiting the ability for one of the tools to use test wafers from at least one of a plurality of upstream tool sources.

2. The method of claim 1, wherein the individual demand by each tool takes into account a recycle rate of the test wafers.

3. The method of claim 2, wherein the individual demand by each tool takes into account the individual failure rate of the test wafers used by each tool.

4. The method of claim 1, wherein the respective flow demand for one of the flows is determined by a maximum individual demand among each of a subset of the plurality of tools that is included in that one flow.

5. The method of claim 1, wherein:
at least one group of test wafers processed by one tool is capable of a plurality of downgrade uses, and
the at least one group of test wafers are assigned to each of the plurality of downgrade uses in proportion to a demand for test wafers by each respective one of the plurality of downgrade uses.

6. The method of claim 1, wherein step (b) includes taking into account the ability for one of the tools to use test wafers from a plurality of upstream tool sources.

7. The method of claim 1, wherein step (c) includes taking into account the ability to use test wafers from one of the tools in a plurality of downstream tools.

8. The method of claim 1, wherein step (a) includes calculating individual demand based on usage of the test wafers for time-based monitoring and wafer based monitoring.

9. A method for modeling usage of semiconductor test wafers, comprising the steps of:
(a) calculating an individual demand for test wafers by each of a plurality of tools;
(b) assigning the plurality of tools to a plurality of levels based on ability of each tool to use wafers that have been processed by another one of the plurality of tools;
(c) assigning wafers made available by one of the plurality of tools to at least two other ones of the plurality of tools in proportion to the individual demands of each of the at least two other tools;
(d) determining a total demand for test wafers, based on the number of wafers assigned to each of the plurality of tools in the lowest one of the plurality of levels.

10. The method of claim 9, wherein a tool is assigned to the lowest one of the plurality of levels if wafers processed by that tool are only usable as test wafers after recycling or reclaiming, or if wafers processed by that tool cannot be reused, recycled or reclaimed.

11. The method of claim 9, wherein a tool is assigned to a second lowest one of the levels if wafers processed by that tool are only usable as test wafers by tools in the lowest level.

12. The method of claim 10, wherein a tool is assigned to a level N of the plurality of levels if wafers processed by that tool are only usable as test wafers by tools in levels from level 0 to level N-1.

13. The method of claim 9, wherein the individual demand for each respective tool is increased to a total number of wafers provided to that respective tool by upstream tools.

14. The method of claim 13, wherein the total demand for wafers is the sum of the individual demands for wafers by all of the tools at the lowest level.

15. The method of claim 9, wherein the individual demand by each tool takes into account a reuse rate of the test wafers.

16. The method of claim 15, wherein the individual demand by each tool takes into account the individual failure rate of the test wafers used by each tool.

17. The method of claim 9, wherein:
at least one group of test wafers processed by one tool is capable of a plurality of downgrade uses, and
the at least one group of test wafers are assigned to each of the plurality of downgrade uses in proportion to a demand for test wafers by each respective one of the plurality of downgrade uses.

18. The method of claim 9, wherein step (a) includes calculating individual demand based on usage of the test wafers for time-based monitoring and wafer based monitoring.

19. A method for modeling usage of semiconductor test wafers, comprising the steps of:
(a) calculating an individual demand for test wafers by each of a plurality of tools;
(b) assigning the plurality of tools to a plurality of levels based on ability of each tool to use wafers that have been processed by another one of the plurality of tools;
(c) assigning wafers made available by respective ones of the plurality of tools to downstream tools in the plurality of tools, including assigning wafers made available by one of the plurality of tools to at least two other ones of the plurality of tools in proportion to the individual demands of each of the at least two other tools;
(d) determining a total demand for test wafers, based on the number of new or reclaimed wafers assigned to a subset of the plurality of tools, wherein the new or reclaimed wafers are not provided from upstream tools within the plurality of tools.

20. The method of claim 19, wherein a tool is assigned to the lowest one of the plurality of levels if wafers processed by that tool are only usable as test wafers after recycling or reclaiming, or if wafers processed by that tool cannot be reused, recycled or reclaimed.

21. The method of claim 19, wherein a tool is assigned to a second lowest one of the levels if wafers processed by that tool are only usable as test wafers by tools in the lowest level.

22. The method of claim 21, wherein a tool is assigned to a level N of the plurality of levels if wafers processed by that tool are only usable as test wafers by tools in levels from level 0 to level N-1.

23. The method of claim 19, wherein the individual demand for each respective tool is increased to a total number of wafers provided to that respective tool by upstream tools.

* * * * *